United States Patent [19]

Haque

[11] Patent Number: 5,748,010

[45] Date of Patent: May 5, 1998

[54] LOGIC SIGNAL LEVEL TRANSLATION APPARATUS HAVING VERY LOW DROPOUT WITH RESPECT TO THE POWERING RAILS

[75] Inventor: Yusuf A. Haque, San Jose, Calif.

[73] Assignee: Maxim Integrated Products, Sunnyvale, Calif.

[21] Appl. No.: 582,227

[22] Filed: Jan. 3, 1996

Related U.S. Application Data

[63] Continuation of Ser. No. 414,357, Mar. 30, 1995, abandoned.

[51] Int. Cl.$^6$ ............... H03K 19/0175; H03K 19/094
[52] U.S. Cl. ................... 326/80; 326/68; 326/81; 326/53; 326/34
[58] Field of Search ................. 326/68, 80, 81, 326/56, 58, 34

[56] References Cited

U.S. PATENT DOCUMENTS

| | | |
|---|---|---|
| 4,469,959 | 9/1984 | Luke et al. ............................ 326/68 |
| 4,847,522 | 7/1989 | Fuller et al. . |
| 4,958,091 | 9/1990 | Roberts ................................. 326/81 |
| 5,414,314 | 5/1995 | Thurber, Jr. ........................... 327/427 |
| 5,436,585 | 7/1995 | DiMarco ............................... 326/81 |
| 5,574,389 | 11/1996 | Chu ...................................... 326/81 |

*Primary Examiner*—Edward P. Westin
*Assistant Examiner*—Richard Roseen
*Attorney, Agent, or Firm*—Blakely, Sokoloff, Taylor & Zafman LLP

[57] ABSTRACT

A logic signal level translation method and apparatus having very low dropout with respect to the powering rails and having a tri-state mode of operation allowing the output terminal to be driven to voltages beyond the highest supply voltage coupled thereto without significant power dissipation within the circuit. The output circuit includes well or body snatching devices which are controlled to assure that the wells of the output devices are able to follow extremes in voltage of the output terminal without biasing to conduction a PN junction of one or more of the output devices. A preferred embodiment is disclosed.

5 Claims, 4 Drawing Sheets

LOGIC SIGNAL LEVEL TRANSLATION APPARATUS HAVING VERY LOW DROPOUT WITH RESPECT TO THE POWERING RAILS

This is a Continuation Application of application Ser. No. 08/414,357, filed Mar. 30, 1995 now abandoned.

BACKGROUND OF THE INVENTION

1. Field of the Invention

The present invention relates to the field of logic signal level translation circuits and methods.

2. Prior Art

In certain data transmission circuits, it is required to translate a logic signal with relatively low voltage logic levels, such as zero volts representing a zero level and 3 volts for a one level, to one with logic levels very close to the power supply rails that drive the level translator such as, by way of example, close to a −6.5 volt rail for a zero level and close to a +6.5 volt rail for a one level. Further, the output of the level translator should be capable of driving relatively low output resistances such as, by way of example, 3,000 ohms, and be capable of driving high capacitance loads such as, by way of example, 2,500 pF at relatively high data rates, such as 120 Kbits per second and above. Driving relatively low output resistances and/or relatively high capacitance loads at relatively high data rates requires the capability of delivering substantial current into the load. This may be achieved with various prior art techniques, though because of the voltage level shifts in the output stage, such as caused by emitter-base voltage shift of a bipolar transistor, the output voltage level achieved with prior art techniques is significantly lower than the power supply rails. While suitable for some applications, these techniques are not suitable for use in many other applications. By way of example, many newer circuits are being designed to operate on low voltage power supplies to reduce power consumption and otherwise be more compatible with battery power sources. Such circuits, however, need to provide outputs at logic levels compatible with the common logic levels used for higher voltage circuits which may be connected to the same bus or communication line. Currently, circuits are being designed for operation on 3 volts and 2.7 volts, though are required to provide a logic high output signal on the order of 5 volts. Voltage doublers provide a convenient way of stepping up a voltage to provide a higher voltage supply, though doubling, particularly of a 2.7 volt supply, requires an output circuit to operate close to the positive rail to obtain a 5 volt logic high signal, a condition which cannot be achieved if a base-emitter voltage drop of a junction transistor is imposed on the doubled voltage to provide the output signal.

Still another prior art technique achieves the desired function but requires additional control circuitry. In that regard, it is generally desired to operate such circuits in a tri-state mode, so that when the same are not selected or active, they have a high output impedance, even if the output terminal is pulled above the upper or below the power supply rail by some other active circuit connected in common therewith.

BRIEF SUMMARY OF THE INVENTION

A logic signal level translation method and apparatus having very low dropout with respect to the powering rails and having a tri-state mode of operation allowing the output terminal to be driven to voltages beyond the highest supply voltage coupled thereto without significant power dissipation within the circuit. The output circuit includes well or body (substrate) snatching devices which are controlled to assure that the wells of the output devices are able to follow extremes in voltage of the output terminal without biasing to conduction a PN junction of one or more of the output devices. The voltage drop from the powering rails to the output can be made arbitrarily small.

A preferred embodiment which includes a power down capability keeping the circuit active but in a very low power, high impedance output impedance state is disclosed.

BRIEF DESCRIPTION OF THE DRAWINGS

FIG. 1 comprising

DETAILED DESCRIPTION OF THE INVENTION

Figure 1A:
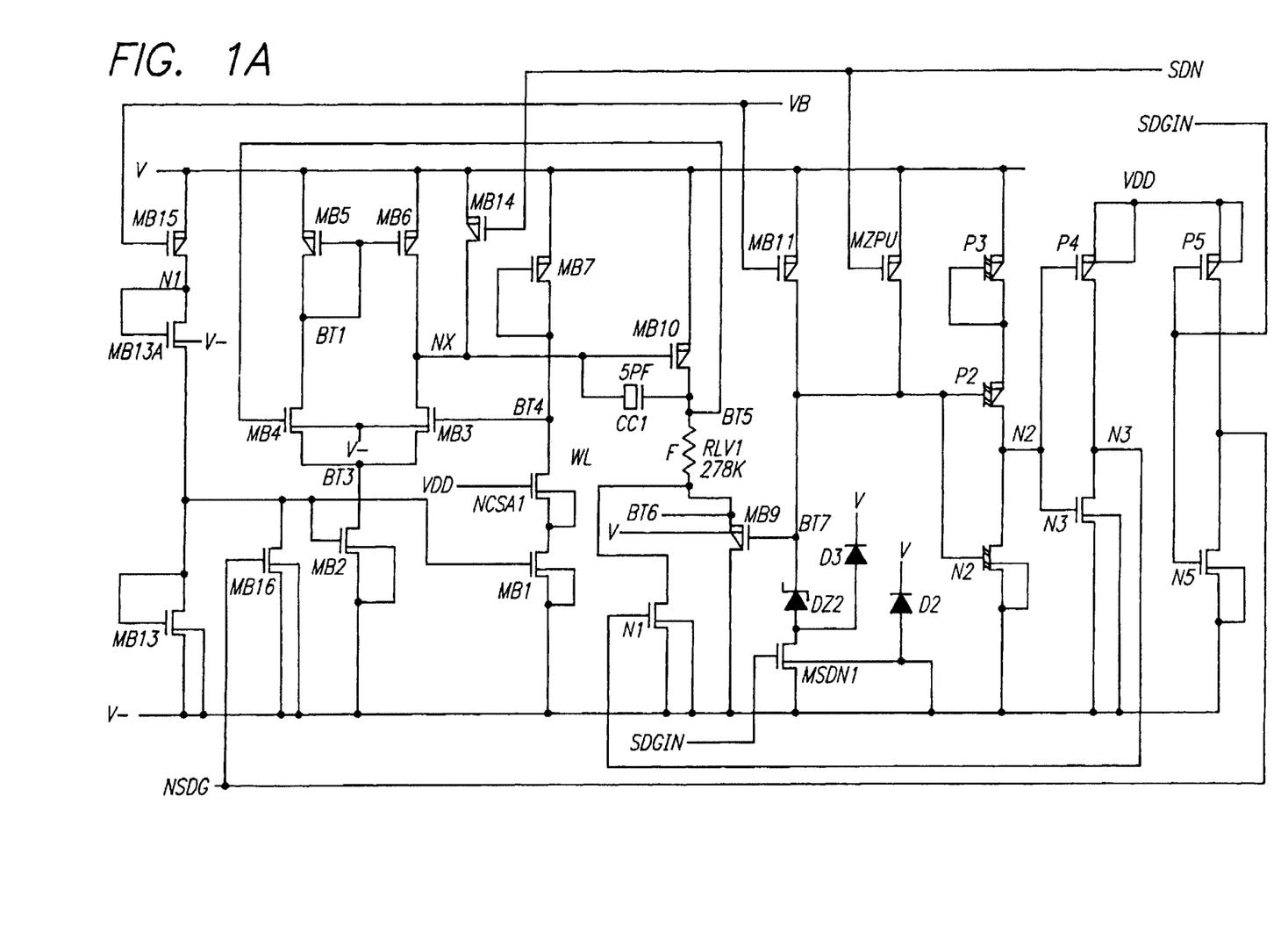
FIGS. 1a through FIGS. 1d, is a circuit diagrams of a biasing circuit for the preferred embodiment of the present invention.

FIG. 1a, a circuit for generating a bias signal and shut-down signals for the other circuits the present invention may be seen. This circuit is operative in response not only to the power supply voltages V and V−, but also is responsive to a bias voltage VB and shut-down signals SDN and SDGIN. The bias voltage VB is a bias voltage for the gates of P channel devices to set the voltage thereof relative to the sources thereof so that the P channel devices may operate as current sources. In normal operation, the shut-down signals SDN and SDGIN are both high, SDN being referenced to the power supply voltage V and the signal SDGIN being referenced to the typically lower power supply voltage VDD.

In normal operation with signal SDN high, P channel devices MB14 and MZPU will both be off. Also with the signal SDGIN being high in normal operation, P channel device P5 will be off and N channel device N5 will be on, pulling the signal NSDG low (to V−). This in turn holds N channel device MB16 off. Also with SDGIN high, N channel device MSDN1 will be on, coupling one side of the Zener diode DZ2 and diode D3 to V−. With bias voltage VB applied to the gate of P channel device MB11, the same acts as a current source, providing current to the node forming the gate connections for P channel device P2 and N channel device N2. However, these devices, as well as diode-connected P channel device P3, have thresholds such that the Zener diode DZ2 holds the voltage of the node sufficiently low to keep P channel device P2 on and N channel device N2 off, holding node N2 high, turning off P channel device P4 and turning on N channel device N3 to pull node N3 low, holding N channel device N1 off.

The bias voltage VB also causes P channel device MB15 to act as a current source, providing current through diode-connected N channel device N1 to set the gate source voltage of diode connected N channel device MB13 to act as a current mirror for N channel devices MB2 and MB1, thereby setting the current through each of these two devices. N channel device MB2 is connected to a circuit comprising P channel devices MB5 and MB6 and N channel devices MB3 and MB4 connected as a differential amplifier. In particular, the current through N channel device MB4 plus the current through N channel device MB3 must equal the current through the N channel current source device MB2. P channel devices MB5 and MB6 are connected as a current mirror so that the current through P channel device MB5 will be mirrored to P channel device MB6. Thus, if the voltages on the gates of N channel devices MB3 and MB4 are equal, the current through the two devices will be equal. The current in N channel device MB4 will be mirrored by P channel device MB5 to P channel device MB6 so that the current into node NX through P channel device MB6 will be equal to the current out of node NX through N channel device MB3 to maintain the circuit in balance. If, on the other hand, the gate voltages on N channel devices MB3 and MB4 are unequal, the circuit will no longer be balanced. If, for example, the voltage on the gate of N channel device MB4 increases, N channel device MB4 will have a higher gate to source voltage compared to MB3. This will cause MB4 to have higher current flow compared to MB3. Note the total current is constant. The increase in current through N channel device MB4 increases the amount of current mirrored to P channel device MB6 by P channel device MB5, increasing the current into node NX. Since, at the same time the current through N channel device MB3 has decreased, the current into node NX will have a net positive value, charging the node to increase the voltage thereof. This will tend to decrease the current through P channel device MB10, reducing the current through resistor RLV1 and N channel device MB9, held on by the voltage drop across the Zener diode DZ2, thereby pulling the voltage on node BT5 lower to readjust the voltage on the gate of N channel device MB4 to rebalance the circuit.

At balance, the voltages on the gates of N channel devices MB3 and MB4 will be equal, barring offset mismatches in the devices. Also since N channel device NCSA1 is on and N channel device MB1 acts as a current source, the voltage on the gate of N channel device MB3 will be the gate-source voltage of P channel device MB7 as the diode connected P channel device is biased to conduct the current of current source device MB1. Also since the gate voltage of device MB4 is the drain voltage of device MB10, the balance point for the voltage of node NX will be the gate voltage for P channel device MB10 that sets a current there through to set the voltage at the top of resistor RLV1 equal to the voltage of the gate of n channel device MB3.

Figure 1B:
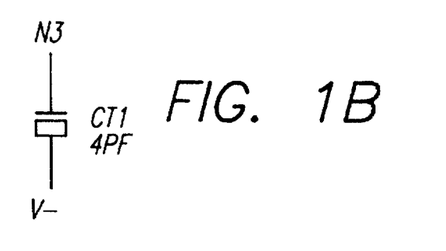

In the circuit of FIG. 1a, capacitor CC1 is provided for stability reasons, and diode D2 provides reverse polarity protection for the circuit with respect to the V, V− supply. The capacitor CT1 of FIG. 1b provides a slight time delay for voltage transitions of node N3, and the diode D1 of FIG. 1d assures that the well WL will never exceed the positive power supply voltage V by more than one forward conduction diode voltage drop. Diodes D1, D2 are there naturally by default by virtue of the process used to manufacture CMOS circuits.

Figure 1C:
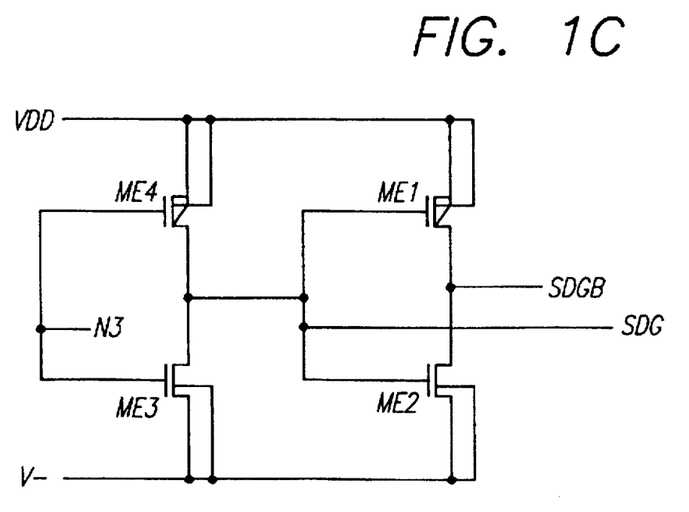
Figure 1D:
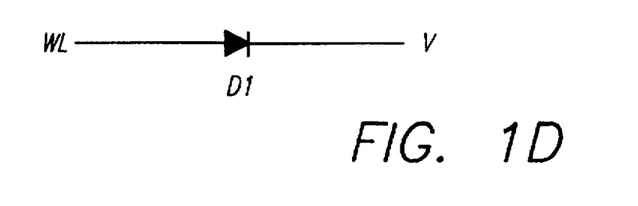

The circuit of FIG. 1c comprises a pair of inverters formed by P channel devices ME4 and ME1 and N channel devices ME3 and ME2. Devices ME3 and ME4 invert the voltage of node N3 to form the signal SDG, and the devices ME2 and ME1 invert the signal SDG to form the signal SDGB. Thus the signal SDG will be the inverse of the signal on node N3, and the signal SDGB will follow the signal on node N3.

When the circuit is shut-down or inactive, the signals SDN and SDGIN go low. The signal SDGIN going low turns on P channel device P5 and turns off N channel device N5, pulling signal NSDGN high. It also turns off N channel device MSDN1. With signal SDN going low, P channel device MZPU is turned on, pulling node BT7 high to turn on N channel device N2 and turn off P channel device P2 to pull node N2 low, turning on P channel device P4 and turning off N channel device N3 to pull node N3 high, thereby turning on N channel device N1 to pull node MB9 low (V−). At the same time, P channel device MB14 is turning on, pulling node NX high. With signal NSDG high, device MB16 is turned on, pulling the gates of N channel devices MB2 and MB1 to V− to turn off the same independent of the small amount of current through current source MB15, passing to V− through device MB13A and N channel device MB16. Note during shutdown, VB is also pulled to V, thereby eliminating current flows from current sources. Also since the signal on node N3 is the inverse of the signal SDN, the signal SDG will follow the signal SDN, and the signal SDGB will follow the inverse of the signal SDN.

Figure 2:
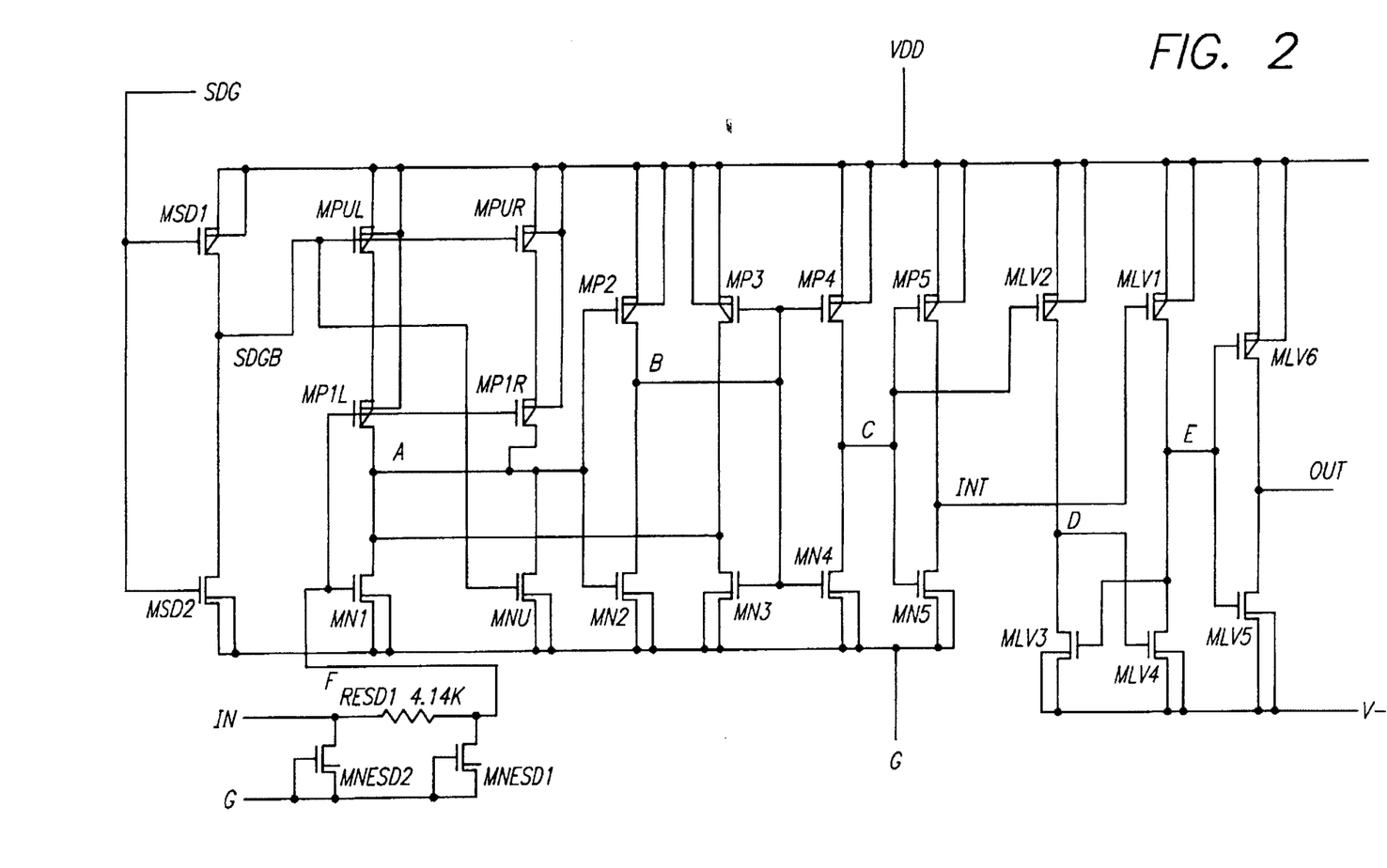
FIG. 2 is a circuit diagram of the input portion of the circuit of the preferred embodiment of the present invention, which circuit portion includes a part of the level translation capability of the present invention.

Now referring to FIG. 2, another portion of the preferred embodiment circuit of the present invention may be seen. The signal having logic levels between ground G and a low voltage supply voltage VDD for which level translation is to be achieved is provided on the input terminal IN. This signal IN typically will have logic levels corresponding to standard levels for a particular logic family such as TTL logic levels, wherein a "1" or "high" is defined as any voltage between a given level and VDD, and a "0" or "low" is defined as any voltage between a lower level and ground G. In addition, the circuit shown in FIG. 1 also has a connection to a minus voltage V− representing the zero or low logic level voltage such as, by way of example, −6.5 volts in the preferred embodiment. Also shown in the circuit is a signal SDG which is held low when the circuit is not active, and sufficiently high when the circuit is active to turn on N channel device MSD2 and turn off P channel device MSD1.

When the signal SDG goes low, making the circuit inactive, N channel device MSD2 is turned off and P channel device MSD1 is turned on, pulling the signal SDGB high to turn off P channel devices MPUL and MPUR and to turn on N channel device MNU. This pulls node A low, independent of the state of conduction of N channel device MN1 and P channel device MPLL. It also turns N channel device MN2 off and P channel device MP2 on, pulling node B high. This turns device MP3 off and device MN3 on, consistent with node A being low at this time. It also turns device MP4 on and MN4 off, pulling node C high, turning on device MN5 and turning off device MP5 to hold node INT low. With node C high, P channel device MLV2 is held off and with node INT low, P channel device MLV1 is turned on, pulling node E high to hold N channel device MLV3 on, pulling node D low to hold N channel device MLV4 off. With node E high, P channel device MLV6 is off and N channel device MLV5 is on, holding the output signal OUT at the V−.

When the circuit is enabled or active by SDG going high, N channel device MSD2 is turned on and P channel device MSD1 is turned off. This turns on P channel devices MPUL and MPUR and turns off N channel device MNU.

The input signal IN is applied through resister RESD1 to the gates of N channel device MN1 and P channel device MP1L, with N channel devices MNESD2 and MNESD1 providing reverse polarity and electrostatic discharge protection on the input terminal. When the input signal IN goes high, N channel device MN1 will turn on and P channel devices MP1L and MP1R will turn off. This pulls node A low, turning off N channel devices MN2 and MN3 and turning on P channel device MP2, pulling node B high to turn on N channel devices MN3 and MN4 and to turn off P channel devices MP3 and MP4. This, in turn, pulls node C low, turning off N channel device MN5 and turning on P channel devices MP5 and MLV2, pulling node D high. With node C low, N channel device MN5 is turned off and P channel device MP5 is turned on, pulling node INT high, turning off P channel device MLV1. Thus, with node D high, N channel device MLV4 is turned on, pulling node E low to turn N channel device MLV3 off. This also turns N channel device MLV5 off and turns on P channel device MLV6, pulling the output node OUT high to VDD.

When the input signal IN goes low, the state of the devices described above reverses, pulling the output node OUT low to V–. In that regard, note that N channel devices MLV3 and MLV4 are cross-coupled as in a flip-flop, with the state of the flip-flop like circuit being determined by which of P channel devices MLV2 and MLV1 is on. Accordingly, the rise time and fall time of the output signal OUT are short, due to the toggle action of the flip-flop like circuit. Also, of course, note that the body of N channel devices MLV3, MLV4 and MLV5 was connected to V–, whereas the body of the remaining N channel devices in the circuit of FIG. 1 is connected to the ground voltage G. Such connections of the body of the devices prevents the source-body and drain-body diodes from becoming forward biased in normal operation of the circuit.

Also note that devices MN2 and MP2 form an inverter, as do devices MN3 and MP3, but that one does not drive the other. Instead, the voltage of node A controls both inverters, forming a Schmitt trigger to provide enhanced noise immunity in the resulting output signal OUT.

Figure 3:
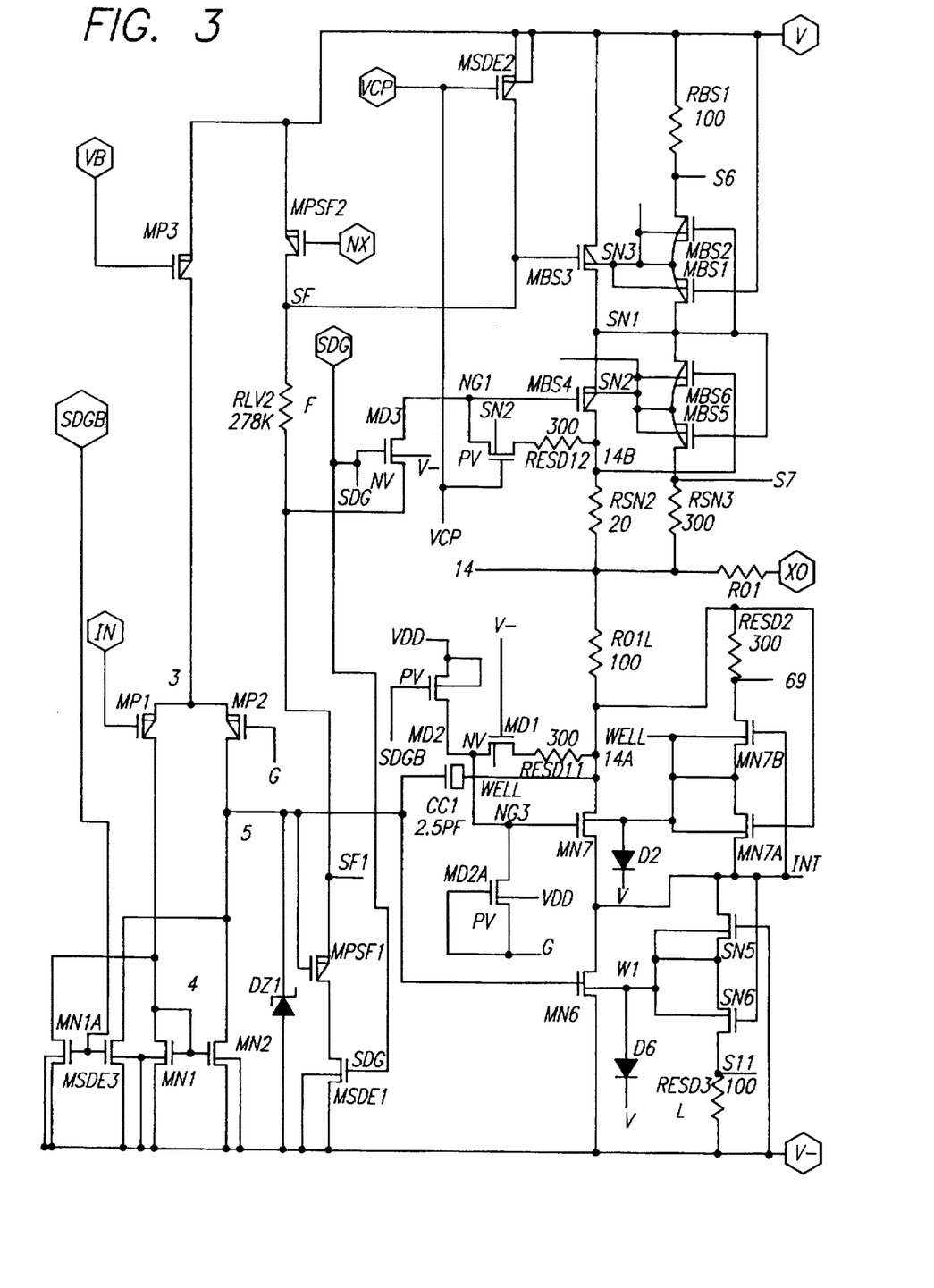
FIG. 3 is a circuit diagram of the remainder of the circuit of the preferred embodiment of the present invention.

Now referring to FIG. 3, the remaining portion of the preferred embodiment circuit of the present invention may be seen. As before, when the circuit is active, the signal SDG is sufficiently high to turn on N channel devices and the signal SDGB is sufficiently low to turn off N channel devices. Also, when the circuit is active, the signal VCP is sufficiently high to turn off P channel devices. As before, the bias voltage VB sets the gate-source voltage of P channel device MP3 to cause the same to operate as a current source.

With the signal SDGB low, N channel devices MN1A and MSDE3 will be off. When the signal IN of FIG. 2 goes high, the signal OUT of FIG. 2 will also go high, as herein before described. This signal OUT of FIG. 2 forms the signal IN of FIG. 3. MP1 is a P channel device with nominal threshold voltage of say around –0.7 V; MP2 is a P channel transistor with a higher threshold voltage, say around –1.3 V. So when "IN" is low, say 0 volts, MP1 will have higher current flow compared to MP2. This causes node 4 to increase in voltage and node 5 to decrease to V–. When "IN" goes positive, say to VDD, MP2 will have more current flowing through it compared to MP1. This will cause node 5 to charge up, diode DZ1 limiting the maximum voltage on node 5, typically around 6 V with respect to V–. DZ1 allows faster operation of the circuit by limiting the voltage swing on node 5. Since the signal SDG is high, N channel device MSDE1 is on. MPSF1 along with RLV2 and MPSF2 forms a source follower. The voltage on node 5 is buffered and with a small amount of voltage level translation appears on node SF1. Node SF and SF1 are separated by a voltage drop equal to the voltage drop across RLV2, which is the product of the current through MPSF2 and the value of RLV2.

Thus, when node 5 is high, nodes SF1 and SF are high, turning MBS3 off and MN6 on. When node 5 is low, MN6 is turned off and node SF is sufficiently low to turn on MBS3 with a large gate source voltage.

P channel device MPSF2 of FIG. 3 is identical to P channel device MB10 of FIG. 1 and is biased identically, resistor RLV2 of FIG. 3 is identical to resistor RLV1 of FIG. 1, P channel device MPSF1 of FIG. 3 is identical to P channel device MB9 of FIG. 1, and P channel device MBS3 of FIG. 3 is identical to P channel device MB7 of FIG. 1. In particular, node NX of FIG. 3 is connected to node NX of FIG. 1. This provides a replicate active biasing scheme which allows transistor MBS3 (FIG. 3) to be essentially turned off when node XO goes negative and turns on transistor MBS3 hard when XO wants to go positive. This active control assures correct operation in the face of process and temperature changes with very low power dissipation.

The output stage of FIG. 3, responsive to the voltage on node 5, is formed by transistors MBS1 through MBS6, MN6 and MN7, MN7A, MN7B, SN5, SN6, MD1 through MD4 and MD2A. When XO wants to slew in the positive direction (the voltage of node 5 being high), transistors MBS3 and MBS4 are on and XO is charged to rail V. The output voltage at node XO is determined by the ratio of the resistive load on XO and the on resistance of transistors MBS3 and MBS4 in series. Transistors MBS1 and MBS2 act as body snatchers for transistor MBS3, and transistors MBS5 and MBS6 act as body snatchers for transistor MBS4. The body snatcher connects the body of the MOSFET (say MBS3) to the most positive voltage that it will encounter on its source/drain with a tolerance of around 0.7 V. Similarly, when XO wants to slew in the negative direction, MN7 and MN8 are turned on and the voltage on XO is determined by the ratio of the resistive load on XO to the series resistance of MN6, MN7. Again, transistors MN7A, MN7B are body snatchers for transistor MN7, and transistors SN6 and SN7 are body snatchers for transistor MN6. The body snatchers in this case connect the body of the MOSFET (say transistor MN7) to the most negative of the source or drain potential. Again, the tolerance is around 0.7 V. The output voltage on XO can be designed to be arbitrarily close to V, V– by appropriately sizing transistors MBS3, MBS4, MN7 and MN6. Resistors RSN2, RSN3, RO1, RO1L are optional and are shown here for completeness. These resistors can help protect the circuit from electrostatic discharges.

The slew rate of the signal on node XO can be controlled by controlling the bias current of transistor MP3. Control can also be exercised by the magnitude of coupling capacitor CC1.

In shutdown mode, transistor MBS3 is turned off by transistor MSDE2, pulling its gate to V. Transistor MN6 is also turned off by transistor MSDE3, pulling its gate to V–. Also in shutdown mode, transistor MD4 is turned on. When the potential on XO rises say to above V, transistor MBS4's gate and source are tied together, and thus the device remains off. The substrate of transistor MBS4 is also connected to the most positive potential the device is subject to and thus, this device remains off with high impedance. Thus, for any positive voltage (less than the breakdown voltage of the transistors in the output stage), the output stage remains in a high impedance state. For all negative voltages, MBS3 remains off, preventing current flow, while the substrates of P channel devices MBS3, MBS4, MD4 are tied to the most positive voltages appropriate for those transistors.

For negative voltages between 6GND and V–, MN6 is turned off and prevents current flow from node XO. The substrate snatchers connect MN7, MN6, MD1 to the appropriate negative voltages. For voltages more negative with respect to V–, MD1 turns on, since its gate is tied to V–, and effectively forces 0 gate to source bias on MN7, shutting off current flow through MN7. Again, the substrates of transistors MN7, MN6, MD1 receive the appropriate substrate bias from the substrate snatchers. Note MD1 and MD4 are high voltage transistors. This allows a relatively higher voltage to be present between the gate and source terminal compared with normal voltage transistors.

Thus, in the shutdown state this output stage remains in the high impedance low dissipation mode for any positive or negative voltage on node XO less than the breakdown voltage of the devices in the output stage. This is true even when the potential on XO is larger in magnitude with respect to V or V−.

Thus:

Node XO is capable of being driven to voltage levels arbitrarily close to V, V−.

Node XO can be driven externally by other drivers to voltage beyond the rails that power it (i.e., V, V−), even when the circuit is active.

The circuit can be powered down into a low current state where the output XO is in high impedance tri-state condition.

The quiescent dissipation of the circuit can be designed to be low (a few tens of μA or lower), the major component of this being the current in transistors MP3, MPSF2 and MBS3. The current in transistors MPSF2 can be made arbitrarily small by picking large values for RLV2. The gate source voltage of MB7 of FIG. 1A is controlled by its device size and drain current in MB1. By choosing lower values of current through MB1, the dissipation of MB7 and MBS3 can be controlled. Note diode DZ2 emulates the behavior of diode DZ1 in FIG. 3. The current in transistor MP3 controls the slew rate of the signal. Increasing the current in transistor MP3 increases the slew rate. Slew rate can also be increased by lowering the value of CC1. The dissipation of the active biasing circuitry of FIG. 1 is primarily in current source transistors MB2, MB11, MB15 and current in transistor MB10, matched to be similar to MPSF2 in FIG. 3. The current in transistors MB2, MB11, MB15 can be made arbitrarily small (typically a few μA's).

There has been described herein a logic signal level translation method and apparatus having very low dropout with respect to the powering rails. While the present invention has been disclosed and described with respect to a preferred embodiment thereof, it will be understood to those skilled in the art that the apparatus and methods of the present invention may be varied without departing from the spirit and scope of the invention.

What is claimed is:

1. A logic level translation circuit having low dropout with respect to the powering rails comprising:

a first circuit coupled between first, second and third power supply terminals, the first circuit being a circuit for receiving an input logic signal referenced to the voltage levels of the first and second power supply terminals and for providing an intermediate logic signal referenced to the voltage levels of the first and third power supply terminals;

a second circuit coupled between the third and a fourth power supply terminal, the second circuit being a circuit for receiving the intermediate logic signal and for providing an output logic signal on an output terminal referenced to the voltage levels of the third and fourth power supply terminals;

the second circuit including a tri-state power down capability responsive to power down signals;

the second circuit also including circuitry coupled to the output terminal for determining the voltage of the body of field effect transistors driving the output logic signal to prevent pn junctions associated with the field effect transistors from becoming forward biased upon the voltage of the output terminal being driven to voltages outside the voltage range of the third and fourth voltages.

2. An output circuit comprising: a circuit coupled between first and second power supply terminals, the circuit being a circuit for receiving a logic signal and for providing an output logic signal on an output terminal referenced to the voltage levels of the first and second power supply terminals, the circuit including first, second and third p-channel devices having their substrates connected in common, and first, second and third n-channel devices having their substrates connected in common;

the first p-channel device having its source coupled to first power supply terminal and its drain coupled to the output terminal;

the second p-channel device having its source coupled to the source of the first p-channel device, its drain coupled to the source of the third p-channel device and to the common substrate and its gate coupled to the drain of the first p-channel device; and, the third p-channel device having its drain coupled to the drain of the first p-channel device and its gate coupled to the source of the first p-channel device, the first n-channel device having its source coupled to second power supply terminal and its drain coupled to the output terminal;

the second n-channel device having its source coupled to the source of the first n-channel device, its drain coupled to the source of the third n-channel device and to the common substrate and its gate coupled to the drain of the first n-channel device; and, the third n-channel device having its drain coupled to the drain of the first n-channel device and its gate coupled to the source of the first n-channel device;

the circuit determines the voltage of the body of field effect transistors driving the output logic signal to prevent on junctions associated with the field effect transistors from becoming forward biased upon the voltage of the output terminal being driven to voltages outside the voltage levels of the first and second power supply terminals.

3. An output circuit comprising:

a circuit coupled between first and second power supply terminals, the circuit being a circuit for receiving a logic signal and for providing an output logic signal on an output terminal referenced to the voltage levels of the first and second power supply terminals, the circuit including first, second and third p-channel devices having their substrates connected in common, and fourth, fifth and sixth p-channel devices having their substrates connected in common;

the first p-channel device having its source coupled to drain of the fourth p-channel device and its drain coupled to the output terminal;

the second p-channel device having its source coupled to the source of the first p-channel device, its drain coupled to the source of the third p-channel device and to the common substrate and its gate coupled to the drain of the first p-channel device;

the third p-channel device having its drain coupled to the drain of the first p-channel device and its gate coupled to the source of the first p-channel device;

the fourth p-channel device having its source coupled to first power supply terminal;

the fifth p-channel device having its source coupled to the source of the fourth p-channel device, its drain coupled to the source of the sixth p-channel device and to the common substrate and its gate coupled to the drain of the fourth p-channel device; and, the sixth p-channel device having its drain coupled to the drain of the fourth p-channel device and its gate coupled to the source of the fourth p-channel device the circuit determines the voltage of the body of field effect transistors driving the output logic signal to prevent on junctions associated with the field effect transistors from becoming forward biased upon the voltage of the output terminal being driven to voltages outside the voltage levels of the first and second power supply terminals.

4. An output circuit comprising:

a circuit coupled between first and second power supply terminals, the circuit being a circuit for receiving a logic signal and for providing an output logic signal on an output terminal referenced to the voltage levels of the first and second power supply terminals, the circuit including first, second and third n-channel devices having their substrates connected in common, and fourth, fifth and sixth n-channel devices having their substrates connected in common;

the first n-channel device having its source coupled to the second power supply terminal and its drain coupled to the source of the second n-channel device;

the second n-channel device having its source coupled to the source of the first n-channel device, its drain coupled to the source of the third n-channel device and to the common substrate and its gate coupled to the drain of the first n-channel device;

the third n-channel device having its drain coupled to the drain of the first n-channel device and its gate coupled to the source of the first n-channel device, the fourth n-channel device having its drain coupled to the output terminal;

the fifth n-channel device having its source coupled to the source of the fourth n-channel device, its drain coupled to the source of the sixth n-channel device and to the common substrate and its gate coupled to the drain of the fourth n-channel device; and, the sixth n-channel device having its drain coupled to the drain of the fourth n-channel device and its gate coupled to the source of the fourth n-channel device the circuit determines the voltage of the body of field effect transistors driving the output logic signal to prevent on junctions associated with the field effect transistors from becoming forward biased uoon the voltage of the output terminal being driven to voltages outside the voltage levels of the first and second power supply terminals.

5. An output circuit comprising:

first and second p-channel devices and first and second n-channel devices, each having a gate, a source, a drain and a substrate, the first p-channel device having its source coupled to a first power supply terminal and its drain coupled to the source of the second p-channel device;

the drains of the second p-channel and the second n-channel devices being coupled to an output terminal;

the first n-channel device having its source coupled to a second power supply terminal and its drain coupled to the source of the second n-channel device;

one p-channel device and one n-channel device being responsive to signals on the gates of the p-channel device and the n-channel device to controllably couple the output terminal to the first and the second power supply terminals, respectively;

the other p-channel device and the other n-channel device being responsive to signals on their gates to controllably turn on and turn off the respective p-channel and n-channel devices;

a first circuit responsive to the voltage on the source and drain of the second p-channel device to couple the substrate of first p-channel device to the higher of the voltages on the source and drain of the p-channel device;

a second circuit responsive to the voltages on the source and drain of the second p-channel device to couple the substrate of the second p-channel device to the higher of the voltages on the source and drain of the second p-channel device;

a third circuit responsive to the voltages on the source and drain of the first n-channel device to couple the substrate of the first n-channel device to the lower of the voltages on the source and drain of the first n-channel device; and, a fourth circuit responsive to the voltages on the source and drain of the second n-channel device to couple the substrate of the second n-channel device to the lower of the voltages on the source and drain of the second n-channel device;

the first circuit being on the same substrate as the first p-channel device, the second circuit being on the same substrate as the second p-channel device, the third circuit being on the same substrate as the first n-channel device, and the fourth circuit being on the same substrate as the second n-channel device.

* * * * *

UNITED STATES PATENT AND TRADEMARK OFFICE
CERTIFICATE OF CORRECTION

PATENT NO. : 5,748,010
DATED : May 5, 1998
INVENTOR(S) : Yusuf A. Haque

It is certified that error appears in the above-identified patent and that said Letters Patent is hereby corrected as shown below:

Column 1,
Line 16, delete "diagrams" and insert -- diagram --.

Column 8,
Line 38, delete "on" and insert -- pn --.

Column 9,
Line 52, delete "on" and insert -- pn --.

Column 10,
Line 26, delete "voltage" and insert -- voltages --.
Line 27, delete "second" and insert -- first --.

Signed and Sealed this

Second Day of May, 2006

JON W. DUDAS
*Director of the United States Patent and Trademark Office*